US008830001B2

United States Patent
Zhuang et al.

(10) Patent No.: US 8,830,001 B2
(45) Date of Patent: Sep. 9, 2014

(54) LOW POWER ALL DIGITAL PLL ARCHITECTURE

(75) Inventors: Jingcheng Zhuang, Allen, TX (US); Robert Bogdan Staszewski, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/134,081

(22) Filed: Jun. 5, 2008

(65) Prior Publication Data
US 2008/0315959 A1 Dec. 25, 2008

Related U.S. Application Data

(60) Provisional application No. 60/945,821, filed on Jun. 22, 2007.

(51) Int. Cl.
*H03L 7/085* (2006.01)
*H03L 7/089* (2006.01)
*H03C 5/00* (2006.01)
*H03L 7/081* (2006.01)

(52) U.S. Cl.
CPC .............. *H03L 7/0814* (2013.01); *H03C 5/00* (2013.01); *H03L 2207/50* (2013.01)
USPC .................. 331/1 A; 331/16; 331/17; 331/18; 331/34; 375/376

(58) Field of Classification Search
USPC .................. 331/1 A, 16, 17, 18, 34; 375/376
See application file for complete search history.

(56) References Cited

U.S. PATENT DOCUMENTS

| | | | |
|---|---|---|---|
| 6,326,851 B1 * | 12/2001 | Staszewski et al. | 331/17 |
| 2003/0141936 A1 * | 7/2003 | Staszewski et al. | 331/16 |
| 2004/0146132 A1 * | 7/2004 | Staszewski et al. | 375/376 |
| 2005/0195917 A1 * | 9/2005 | Staszewski et al. | 375/295 |
| 2006/0038710 A1 * | 2/2006 | Staszewski et al. | 341/143 |
| 2006/0103566 A1 * | 5/2006 | Vemulapalli et al. | 341/155 |
| 2006/0290435 A1 * | 12/2006 | Staszewski et al. | 331/16 |

* cited by examiner

*Primary Examiner* — Arnold Kinkead
*Assistant Examiner* — Richard Tan
(74) *Attorney, Agent, or Firm* — Ronald O. Neerings; Frederick J. Telecky, Jr.

(57) ABSTRACT

A new all digital PLL (ADPLL) circuit and architecture and the corresponding method of implementation are provided. The ADPLL processes an integer and a fractional part of the phase signal separately, and achieves power reduction by disabling circuitry along the integer processing path of the circuit when the ADPLL loop is in a locked state. The integer processing path is automatically enabled when the loop is not in lock. Additional power savings is achieved by running the ADPLL on the lower-frequency master system clock, which also has the effect of reducing spur levels on the signals.

40 Claims, 7 Drawing Sheets

LOW POWER ALL DIGITAL PLL ARCHITECTURE

CROSS-REFERENCES TO RELATED APPLICATIONS

This application claims the benefit of the filing date of copending provisional application U.S. Ser. No. 60/945,821, filed Jun. 22, 2007, entitled "Low Power ADPLL Architecture" to Zhuang et al.

STATEMENT REGARDING FEDERALLY SPONSORED RESEARCH OR DEVELOPMENT

Not Applicable.

FIELD OF THE INVENTION

The present embodiments relate to circuits such as on a chip (IC) or to circuits with discrete components such as on a printed circuit board (PCB) and are more particularly directed to an all-digital phase-locked loop (ADPLL) circuit and architecture.

BACKGROUND OF THE INVENTION

Electronic systems often include PLL's as a basic building block to stabilize a particular communications channel (keeping it set to a particular frequency), to generate a signal, modulate or demodulate a signal, reconstitute a signal with less noise, or multiply or divide a frequency. PLLs are frequently used in wireless communication, particularly where signals are carried using frequency, phase or amplitude modulation. All digital implementations of PLLs are useful for digital data transmission because the circuit blocks are more readily designed and manufactured in the available technologies. For cost, profit and manufacture yield reasons, die area is a premium and there was a need to migrate towards high density, smaller minimum feature size transistor technologies. With today's high density integration process technologies, such as nanometer-scale CMOS, it is possible and easier to process and manipulate digital signals than analog, particularly when the power supply voltage is lower and the signal amplitudes are smaller because digital bits can better overcome signal to noise issues. So an all-digital solution is implemented.

Classically, PLLs are electronic circuits which "predict" the frequency and phase of an input signal by using a voltage or current tunable oscillator that is constantly adjusted to match in phase and/or frequency (and thus lock on) of an input signal. The voltage or current driving the oscillator is representative of the difference in phase and/or frequency of the input signal and the oscillator output is a continually-updated best prediction of the frequency. In the prior-art all-digital implementation, the adjustment is achieved by a closed loop containing various digital circuits, such as shown in example FIG. 1, containing a phase detector (e.g. XOR) to drive a counter indicating the phase difference, the counter to increment or decrement a DCO frequency (digitally controlled oscillator), and the DCO to generate a digital output stream at a frequency that "predicts" the frequency of the input signal going into the phase detector. When the "predicted" frequency matches the frequency of the input signal so that the phase difference is substantially zero, then the ADPLL is in lock.

However, the digital solution has also presented new problems in addition to the generally coarser phase/frequency resolution of prior-art architectures. The new technologies have transistors with large current leakage and power savings became a big problem. Further, an integrated chip for mobile telecommunications in certain standards, such as WCDMA and WLAN, the transceiver circuit block which typically contains a PLL is a larger portion of the entire system. So the current consumption of the PLL (ADPLL) needs to be reduced. Also, noise and spurs created by clocking and synchronizing all the digital circuitry need to be reduced. Performance issues such as better linearity is desired but often difficult to achieve. Finally, lower complexity and lower die area are highly desirable, but again difficult to achieve.

In view of the above issues, there arises a need to address the drawbacks of the prior art digital PLL architectures and circuits, as is achieved by the preferred embodiments described below.

BRIEF SUMMARY OF THE INVENTION

The present invention provides a circuit and architecture for an all-digital PLL that makes use of modern IC semiconductor process technology advantages such as the high speed of the new transistors (e.g. deep-submicron MOSFET) as well as fine device matching, and that reduce the complexity of circuits such as the TDC in the PLL. The reduction in circuitry reduces the noise and improves linearity. The new PLL is compact, low-power and still delivers high phase noise performance. Low power is achieved by creating an architecture with low complexity circuits and minimizing the percentage of high speed digital circuit, and by turning off some circuits under various conditions.

DETAILED DESCRIPTION OF THE INVENTION

Figure 1:
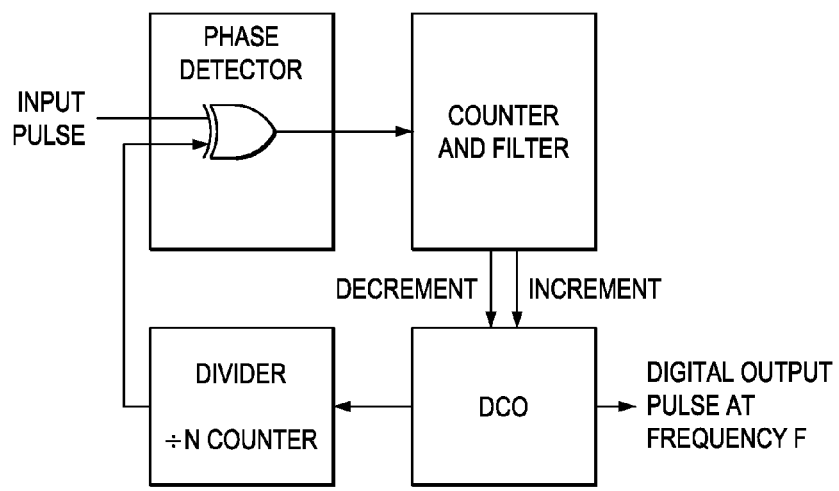
FIG. 1 illustrates a schematic of a prior art ADPLL architecture.
Figure 5:
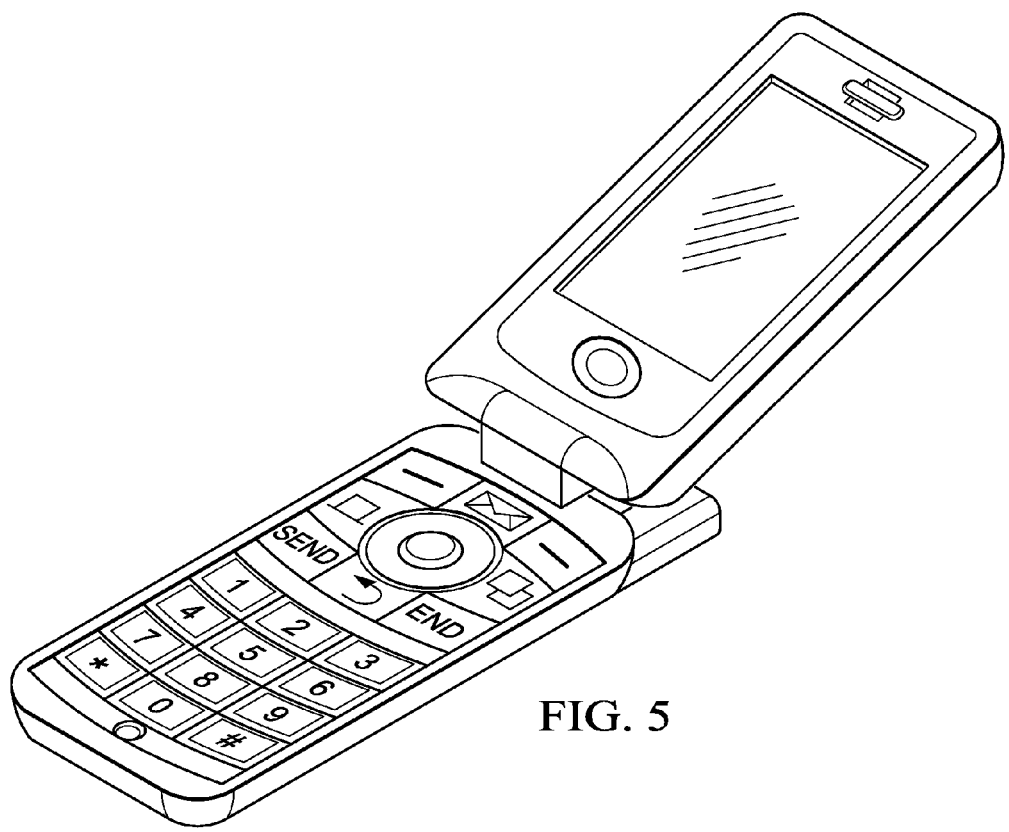
FIG. 5 illustrates an example application which may use the invention.

FIG. 1 is discussed above in the Background of the Invention section of this document and the reader is assumed familiar with the principles of that discussion. To provide an example setting for an all-digital PLL (ADPLL) in a wireless application, FIG. 2 (a and b) shows three main circuit blocks, a baseband signal transmitter block 10, an RF power amplifier with a digital gain control 20 and an ADPLL 30 with frequency modulation capability. The ADPLL contains many sub-circuits including a digitally-controlled oscillator (DCO). The three main circuit blocks together may provide a digital RF radio output signal for a wireless system, such as for a mobile handset (FIG. 5). The transmitter block 10 provides amplitude and phase modulated conversions (CORDIC) of the typical I and Q signals of a baseband codec to a digital transmitter processor (DTX), then further to a sigma-delta amplitude modulator block (SAM) to control the amplitude of the power amplifier 20. The DTX sends phase/ frequency modulated control word data to the ADPLL 30, which receives the master system frequency reference clock input FREF. The ADPLL locks to FREF and generates an output clock that is influenced by the modulated command word from the DTX. The output clock from the ADPLL is sent to the power amplifier with a controllable gain to achieve the amplitude modulation. For purposes of discussion this output clock of the ADPLL is the "desired" clock since it represents the phase modulation of the final transmitted signal and it will be referred to as the RF clock. However, until the ADPLL circuit loop settles and the final "desired" RF clock frequency is reached, the output clock from the DCO (CKV) that is subsequently transmitted to the power amplifier may be considered to be a "predicted" clock that is varying in frequency (thus labeling it the CKV clock) until it settles to some final desired frequency value that is indicative of the FREF frequency and then it can be called the RF clock at the output of the power amplifier.

This method of RF transmission may be part of a Digital RF Processor (DRP™) architecture such as patented by Texas Instruments Inc. It capitalizes on the strengths of nanometer-scale CMOS processes and minimizes the weaknesses of such a technology for RF/analog designs. By implementing traditional RF/analog functions with digitally intensive methods, it is possible to increase the level of integration and improve the ability to port designs rapidly to the latest process node. The DRP architecture is designed to support the significantly increased demand for compact, low-cost, and low-power multimode/multiband wireless products such as for transceivers using Bluetooth, GSM/GPRS/EDGE, WCDMA, WLAN, UMTS, WiMAX, LTE, etc. standards. Due to the drive for yet lower power, the ADPLL architecture is redesigned and improved as described in this disclosure. The ADPLL architecture that this invention improves upon is described in U.S. Patent Publication No. 2006/0033582A1, published Feb. 16, 2006, to Staszewski et al., entitled "Gain Calibration of a Digital Controlled Oscillator," U.S. Patent Publication No. 2006/0038710A1, published Feb. 23, 2006, Staszewski et al., entitled "Hybrid Polar/Cartesian Digital Modulator", and U.S. Patent Publication No 2007/0085623A1, published Apr. 19, 2007, Staszewski et al., entitled "Gain Normalization of a Digitally Controlled Oscillator in an All Digital Phase Locked Loop Based Transmitter," all of which are incorporated herein by reference in their entirety.

Figure 2A:
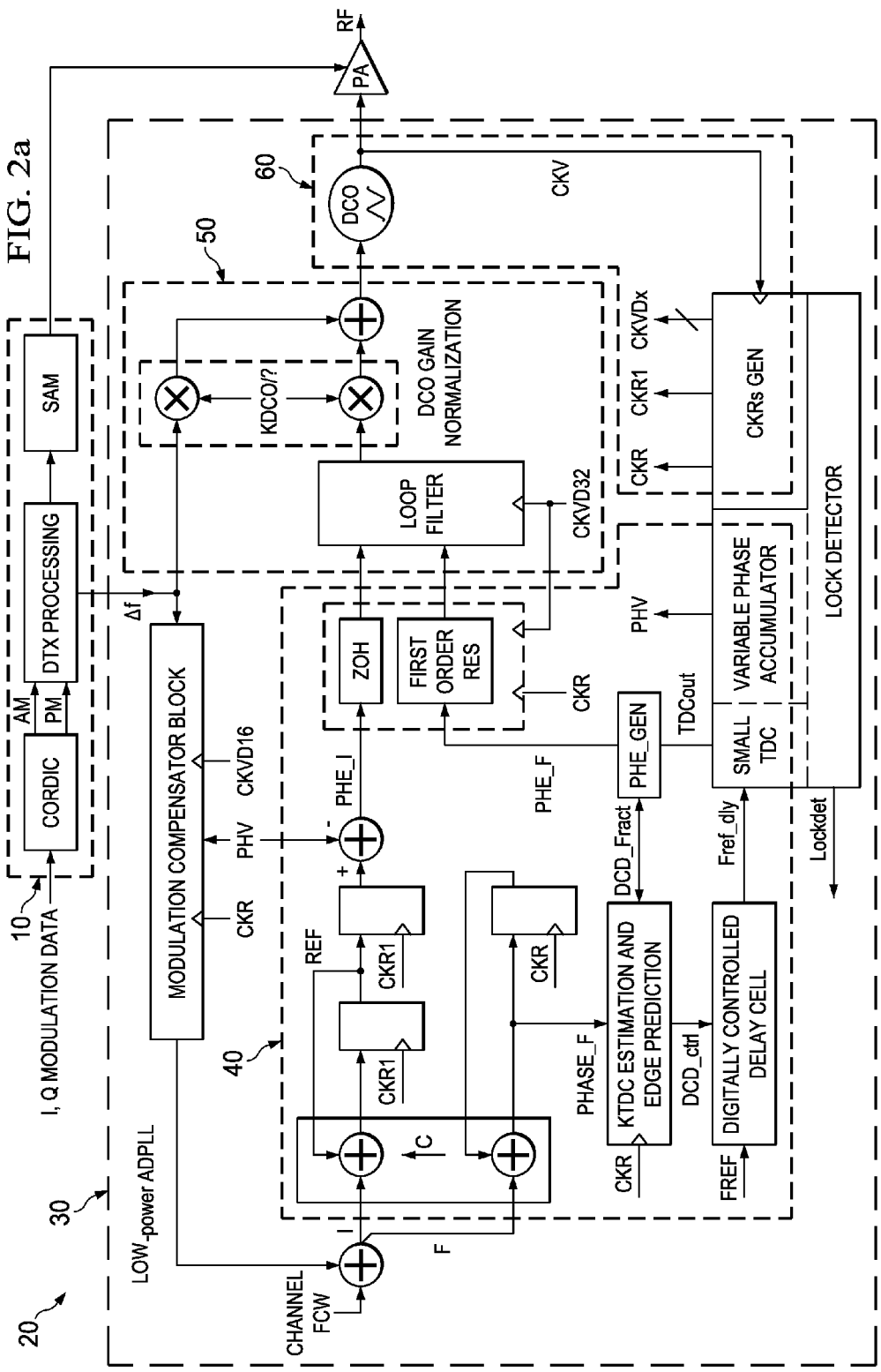
FIG. 2a illustrates a schematic according to one embodiment of the invention.
Figure 2B:
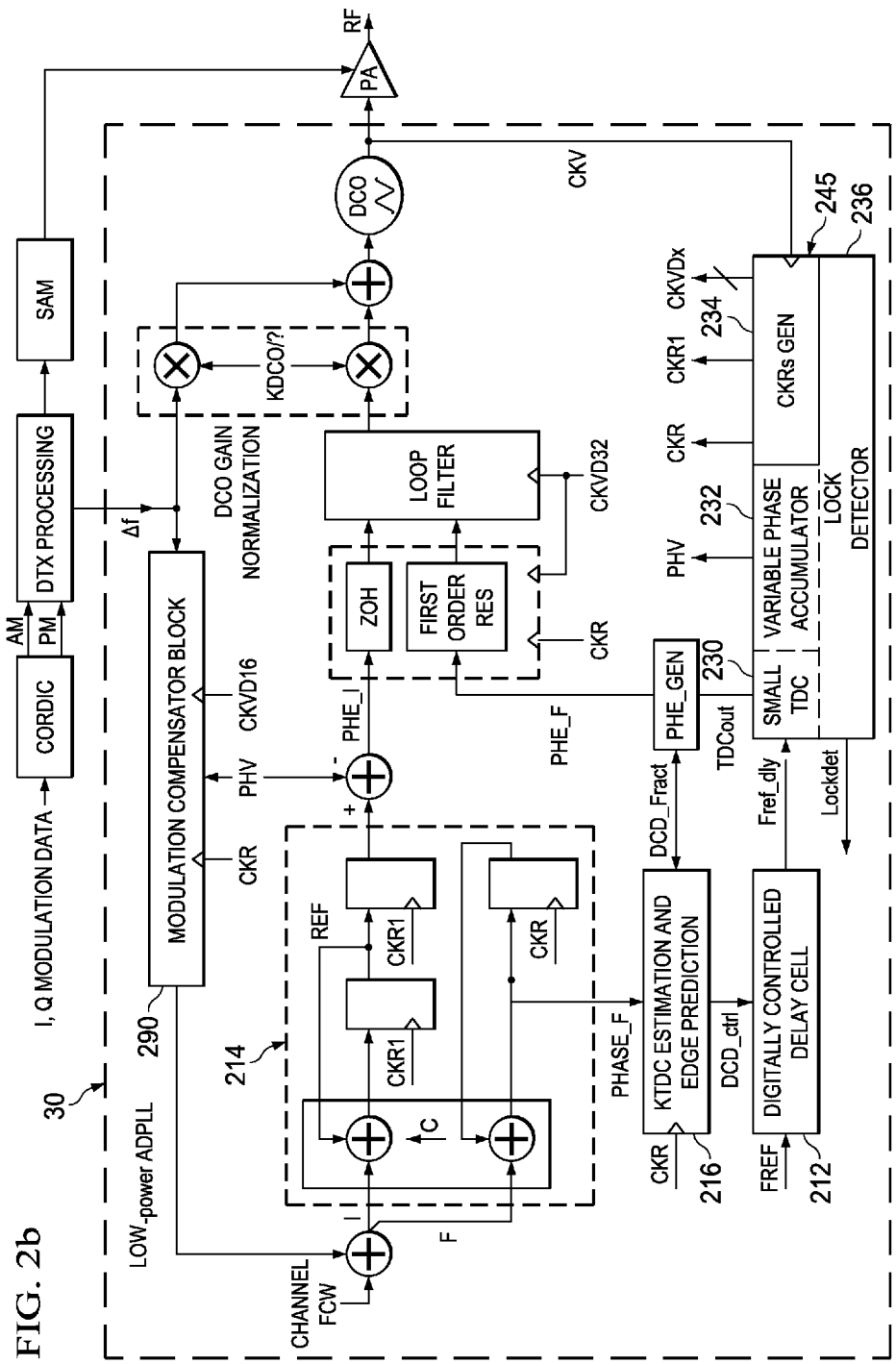
FIG. 2b illustrates the same FIG. 2a but with further details in the labeling of the circuit elements.

The ADPLL 30 in one embodiment, FIGS. 2a and 2b, is described first in general terms—the complex circuitry is grouped into sections using familiar labels in order to provide an over-simplified analogy to a classical analog PLL or to the circuit blocks of prior art FIG. 1, so as to make it easier to understand the operation of the new ADPLL architecture. There is a phase detector section 40, a "counter and filter" section comprising a digital loop filter and an RF clock generation section 60. ADPLL 30 further includes a reference phase accumulator section 214 (FIG. 2b) that calculates an integer reference phase signal (PHR, not shown, it consists of the integer part (REF) and the fractional part (Phase_F)), a phase error detection circuit part of circuit 40 that calculates a fractional error correction (PHE_F), and a variable phase accumulator 232 that calculates an integer variable phase (PHV). Note that the integer and fractional parts are implicitly separated by a radix point in a fixed-point number representation. A total phase error (PHE) is calculated by a phase detector section 40 as PHE=(REF−PHV)+PHE_F. PHE is received by the filter section 50 and an oscillator control circuit section 60. The oscillator control circuit 60 contains a digitally-controlled oscillator (DCO). The DCO generates a variable clock (CKV) that is used to generate down-divided clocks CKVDx, where x is an integer, preferably a power-of-two number, and clocks CKR, CKR1. CKV is also passed to the variable phase accumulator 232 which comprises a counter, which increments on each active edge (i.e., rising or falling) of CKV to produce PHV. A time-to-digital converter (TDC)(230; SMALL TDC) quantizes the time difference of the edges of CKV and the delayed version of the FREF (Fref_dly) to produce TDCout. TDCout is passed to phase generator (PHE_GEN), which is normalized with the fractional part of the predicted phase (DCD_Fract)(e.g., which is output from KTDC ESTIMATION AND EDGE PROTECTION CIRCUIT 216, when the small TDC has higher resolution than DCD).

The FCW (frequency command word) input is a ratio of the desired RF carrier frequency divided by the frequency of FREF. The reference phase signal (PHR) is an accumulation of FCW at the active edge of CKR, which is the retimed version of the FREF. The FCW input to the reference accumulator is used to establish the operating, frequency and can be used to establish a reference phase of the generated local oscillator signal CKV.

In this invention, the reference phase signal PHR is processed as an integer part (REF) and a fractional part (Phase_F). The reference phase accumulator section 214 calculates PHR and produces an integer reference phase signal Phase_I (not shown) separately from the fractional part, Phase_F. The fractional and integer parts of the circuits go on to generate separate error correction PHE results, yielding PHE_I and PHE_F. The fractional phase detection circuit sections, including the edge prediction, delay cell, small TDC and PHE_GEN determine a difference fractional part of the phase error (PHE_F). And the variable phase signal PHV described earlier comprises primarily an integer part variable phase signal, which is compared to the integer part of the reference to generate the integer path error (PHE_I). For a steady state situation in type-II PLL configuration, without drift or modulation, the Phase_I will equal PHV and the PHE_F will be close to zero (the fractional part of the phase error is generated with the output of the small TDC and the fractional path of the predicted phase if the small TDC has higher resolution than the DCD). One aspect of the invention is to separately process the integer part and the fractional part of the phase edge calculations and measurements. Under certain circumstances, the circuitry for the integer part may be turned off to save power.

The new ADPLL 30 is now described with more detail in one preferred embodiment, FIG. 2b. It has a phase detector section (element 40 in FIG. 2a), a loop filter (element 50 of FIG. 2a), and a digital oscillator clock section (element 60 of FIG. 2a). There is an additional input from another circuit block such as from a digital transmit block, which is not normally found in more traditional PLL's where the loop filter does not receive actively varying, extra input signals. Depending on the nature of the extra input signal, whether it is varying due to a phase, frequency or amplitude modulation, that variation typically must be accounted for, compensated for, or subtracted out in some way from the overall ADPLL loop in order for the loop to remain stable and frequency locked. Therefore, there is an extra circuit block 290, which is a compensator block. In the case of the DRP wireless example, where the extra input signal may be a phase modulated command word, then the compensator block is to provide the resampled (generally, a differentiation and resampling operation) outputs of the modulation command word so that the filtered outputs may be "subtracted out" from the overall loop to account for phase modulation effects. Alternatively, the output of the compensator block may be added to the reference phase accumulator output so that the differentiation operation can be eliminated. In this case, only the fractional parts of the modulating phase and the reference phase (PHASE_F) are added while the integer parts of them may be discarded to further save the power and reduce the complexity.

The ADPLL 30 calculates a reference phase edge based on Phase_F and produces a reference DCO edge (Fref_dly) with the digitally-controlled delay cell (DCD). The ADPLL also provides the oscillator output phase edge (CKV) from the digitally controlled oscillator DCO path. An integer part of the phase error ($PHE_{13}$ I) or difference is obtained by subtracting the integer numeric representation of the CKV phase (PHV) from the reference phase (REF), while the fractional part of the phase error is obtained by measuring phase or time difference of the reference DCO edge (Fref_dly) and the actual DCO edge (CKV) (and counting for the DCD_Fract if necessary). The resampled combination (typically their sum) of the integer and fractional parts of the phase error is fed to the digital loop filter, which updates the DCO frequency tuning word to minimize the phase error and achieve phase locking. Once the loop is in lock, the integer part of the phase error is safely assumed to be zero and the circuitry that processes and is related to the integer part can be turned off to save power.

The phase detector section of FIG. 2b (element 40 of FIG. 2a) receives an input master clock pulse FREF from the system—FREF, as with all the other pulses processed by the circuits described, may have 50% duty cycle or some other duty cycle. The FREF input clock goes into a digitally-controlled delay cell 212. The phase detector section is clocked on CKR that is generated using the Fref_dly and CKV by the oscillator section 60. A digitally controlled oscillator, DCO, generates a clock CKV that is further passed to clock regenerators to produce CKR. The phase detector section also receives a frequency command word (FCW) that determines a ratio of the frequency of the output clock from the DCO and the reference frequency of FREF. FCW is a scaling parameter and may have a value in the range such as 10-200—FCW is the ratio of the desired CKV frequency divided by the FREF frequency. The FCW may be summed with a signal from the compensator block 290 to correct for variations and modulations from additional signals injected in the PLL loop. FCW generally has a non-zero integer part, value I, and a non-zero fractional part, value F (e.g., 2.38, 2 is the integer and 0.38, the fraction). The integer and fractional portions of the FCW go into a reference phase accumulator block 214, which accumulates and delays the integer value to generate an integer reference phase that is subsequently used to compute an integer phase error (difference) PHE_I. Circuit block 214 also generates a fractional reference phase Phase_F by accumulating (summing) the fractional portion of FCW during each CKR period. One output of the accumulator is the Phase_F, a fractional reference phase signal that is sent to an estimation and edge prediction block 216 to determine or predict the location of the next reference DCO edge with respect with FREF. The difference between the reference DCO edge and the actual DCO edge is quantized and used to compute PHE_F. Under full alignment, the PHE_I is zero and PHE_F are very small. When PHE_F is substantially zero or a very small value, it is already an indication that the system is in lock. This lock condition is checked by the lock detector 236. When the system is in lock, which is most of the time when the application is in operation, such as a phone call in a handset, then it is possible to save power by turning off certain parts of the ADPLL. For example, circuit block 234 no longer needs to generate a clock CKR1 for the integer path of the reference accumulator block 214. The summer, registers, flip-flops clocked by CKR1 of the integer path may all be turned off. In addition, the circuitry near the circuit node labeled PHE_I, such as the summer, registers and side circuitry (resampler, rate conversion circuitry "ZOH") may also be turned off along the integer phase error PHE_I generation path to save power.

The generation of the fractional phase error PHE_F is harder to understand and to implement for an ADPLL than for, say, an analog PLL where an integer and its associated fraction are not separable and are processed together by the loop. In addition, in a digital representation, there is a carry bit to indicate when the fraction becomes near enough to one or near to zero to become a whole integer. The reference phase accumulator has register circuitry to handle the carry bit which, too, may be turned off when the system is in lock.

The fractional reference phase signal Phase_F is generated from the composite reference phase accumulator 214. Phase_F is passed to a small, local circuit loop containing the edge prediction circuit 216, the digitally controlled delay cell 212, a TDC (time-to-digital converter) 230 which digitizes and provides a digital word TDCout, used in the phase error generation block (PHE_GEN) for the phase error calculation together with the DCD_Fract. The purpose of this small, local circuit loop is to generate the fractional phase error PHE_F.

Continuing with FIG. 2b, the integer part of the phase error PHE_I is obtained by subtracting PHV (generated by a variable phase accumulator 232) from the integer part of the reference phase (REF) produced by circuit 214. Both the integer phase error PHE_I and the fractional phase error PHE_F may be resampled to CKVD32, a rate of the DCO clock output frequency CKV divided by 32, in order to allow the loop corrections to be merged with the high-rate modulating data samples. The resampled. PHE_I and PHE_F are then filtered by a low pass loop filter to generate a substantially constant value, or a very slowly varying value, to control the DCO. The nearly constant value may be summed together with a varying input from an external source, such as phase modulated data from the digital transmit pulse-shape processor. Controlled by the output from the summation, the DCO then generates the predicted clock output CKV. Continuing, along the loop path, CKV is distributed to the circuit block 245 that contains a TDC 230, the variable phase accumulator 232, clock generators 234, and a lock detector 236. The clock generators provide retimed or divided down clocks, an important one being CKR, which is FREF retimed with the CKV. CKR1 is substantially the same as CKR, but CKR1 is used to clock the circuitry for processing the integer part of the frequency command word (FCW). Outside of the loop path, when the ADPLL is in a lock condition and steady state operation, the predicted clock CKV is at the desired output clock frequency and phase. CKV is buffered and amplified by the power amplifier 20 to produce the desired output RF signal that may be transmitted to base stations and other receivers. Alternatively, CKV is used as a local oscillator (LO) signal, and can be used for down-conversion of received RF signals.

Operation of the various circuit sections is now described starting with the reference phase accumulator 214. It consists of an integer part and a fractional part (there is a carry signal from the fractional part to the integer part), and it is used to calculate the reference phase by accumulating the frequency command word (FCW). The fractional part of the reference phase is used by an edge prediction circuit to determine the ideal DCO edge location based on an estimated gain of the TDC 230 or the digitally-controlled delay cell (DCD, 212). For an ideal prediction and an ideal DCD, the relation between the delay of the DCD and the fractional part of the reference phase is: Delay=Tv*(1−F), where Tv is the DCO period and F is the fractional part value. Such a delay is realized by the DCD with a certain resolution and the fractional delay (DCD_Fract) is passed to the PHE_GEN for the calculation of the PHE_F. In the locked condition, the timing variation between the edges of the DCD output and the DCO output varies within a small range, i.e. within one or two inverter delays. Such variation is detected by the TDC within a narrow working range (such as, delay of four or five inverters). The output of the TDC is encoded and normalized using an estimated TDC gain KTDC (in element 216) and used to calculate the fractional part of the phase error (PHE_F).

The DCD output (Fref_dly, the delayed FREF clock), that was delayed by the amount Delay presented above, is sampled by the DCO clock (CKV) to produce the CKR signal, which is used by other building blocks. Because the output of the DCD is roughly synchronized with the DCO output in the locked condition, the transition of Fref_dly can be adjusted (such as by adding a constant offset) so that it is far away from the sampling point. Consequently, the mean time between failures (MTBF), such as caused by metastability of the sampler in the element 232, can be sufficient long, especially during normal operation.

Processing of the integer path is relatively straightforward compared to the fractional path. The integer part of the phase error is obtained by subtracting the PHV sampled result of a DCO cycle counter within the variable phase accumulator 232 and the integer part of the reference phase. In the locked condition, the integer part of the phase error remains zero and the integer part can be disabled to significantly reduce the power consumption.

The integer part is enabled in the frequency/phase acquisition process and disabled once the loop is in lock. The disabled integer part is automatically re-enabled whenever the loop is output of lock, which may be caused by a sudden change of the FCW, the power supply voltage, the temperature, and so on. A lock detection circuit 236 is included in the ADPLL to switch on/off the integer part by producing signal INTsw and gating the clock of the integer processing pathway (CKR1). The lock detector determines whether the loop is in lock by monitoring the outputs of the TDC. In the locked condition, the thermometer-coded TDC outputs should have both ones and zeros. However, when the loop is out of lock, the TDC outputs may have only long strings of ones or zeros, which can be detected by simply monitoring the first and the last bits of the thermometer-coded TDC outputs. Thus the lock detector is a relatively small circuit consuming very little power.

Figure 6:
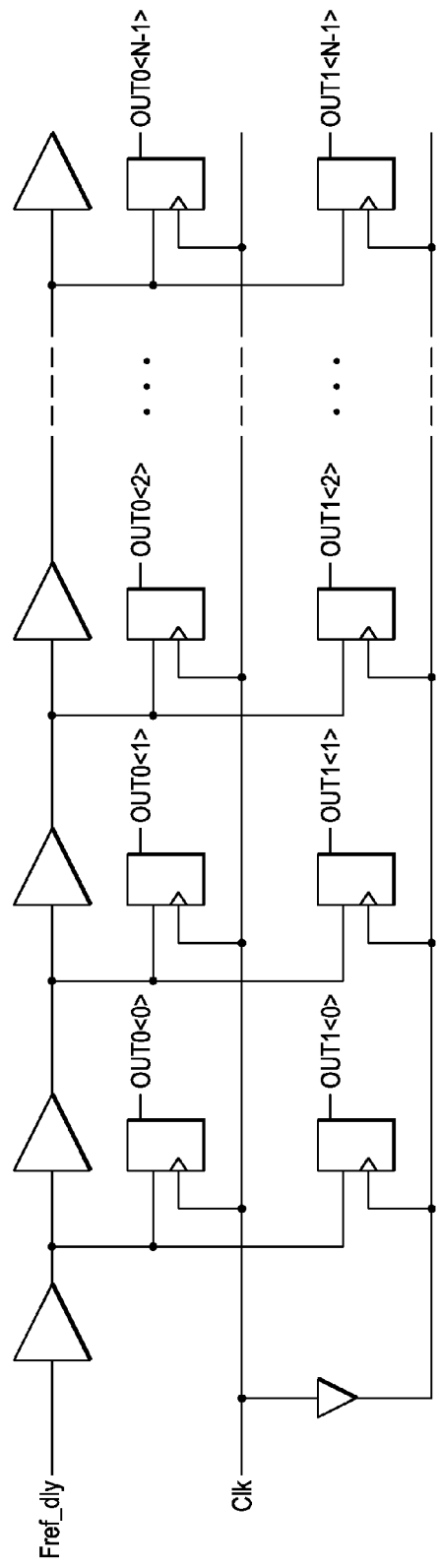
FIG. 6 illustrates a schematic for one possible implementation of the high-resolution TDC.
Figure 7:
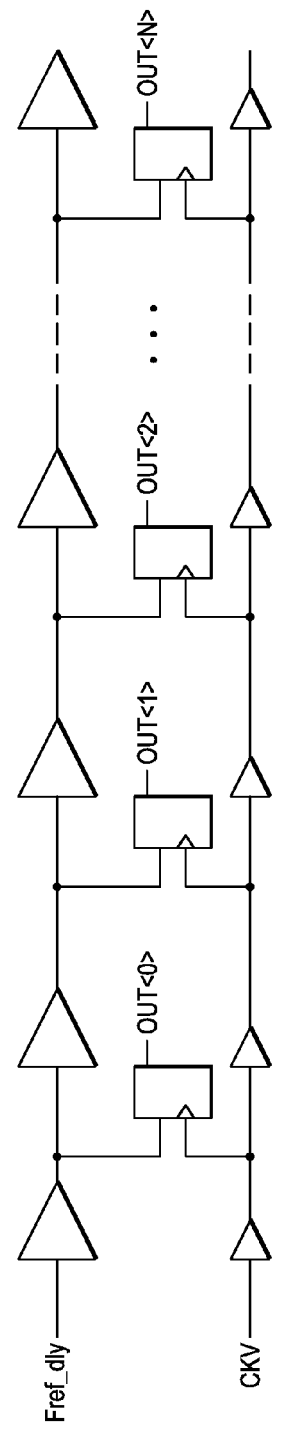
FIG. 7 illustrates a schematic for another possible implementation of the high-resolution TDC.

The TDC operates within a very small range compared to previous designs, which makes it possible to implement a TDC with a much finer timing resolution. A possible implementation of the high-resolution TDC is shown in FIG. 6, in which extra sampling stages, clocked by the delayed input clock, are employed. The delay of the clock is one half of the delay of the Fref_dly delay cells in this case. The output of such high-resolution TDC is generated by combining the outputs of two set of samplers. Further resolution enhancement can be achieved by adding more sampler chains and reducing the delay of the clock. Another possible implementation of the high resolution TDC is shown in FIG. 7, in which the timing resolution equal to the difference between the delays of the Fref_delay and the clock.

In the case when the resolution of the TDC is higher than the resolution of the digitally-controlled delay cell (or the edge prediction output), the error residue (DCD_Fract) of the edge prediction would be subtracted from the TDC output so that the overall phase resolution follows the resolution of the TDC. The TDC input and the samplers (within element 232) can also be turned off between the transitions of FREF. The TDC input is turned on at the rise edge of Fref_dly, and turned off after the rise edge of CKV while its output TDCout is still maintained. The samplers can be turned off after the rise edge of CKR and turned on at the rise edge of the Fref_dly. The fall edge of the Fref_dly may be used to reset the samplers.

On the rising (active) edge of the integer part switching signal, the CKV counter and the FCW accumulator would be reset and the proper reset timing would be considered to ensure a smooth transition when the integer part is turned on.

A separate frequency divider (from the variable phase accumulator) in element 234, to reduce the rate of CKV, is provided in this low-power ADPLL to generate CKVDx signals, where "x" indicates a divide ratio. A simple binary ripple counter is preferentially used as the frequency divider as there is no critical timing requirement on those CKVDx signals. So, again the circuit is small and saves power.

In the normal operation, all components (for the phase/frequency detection and quantization) operate at the rate of the FREF clock and low power is consumed by the ADPLL.

Figure 3:
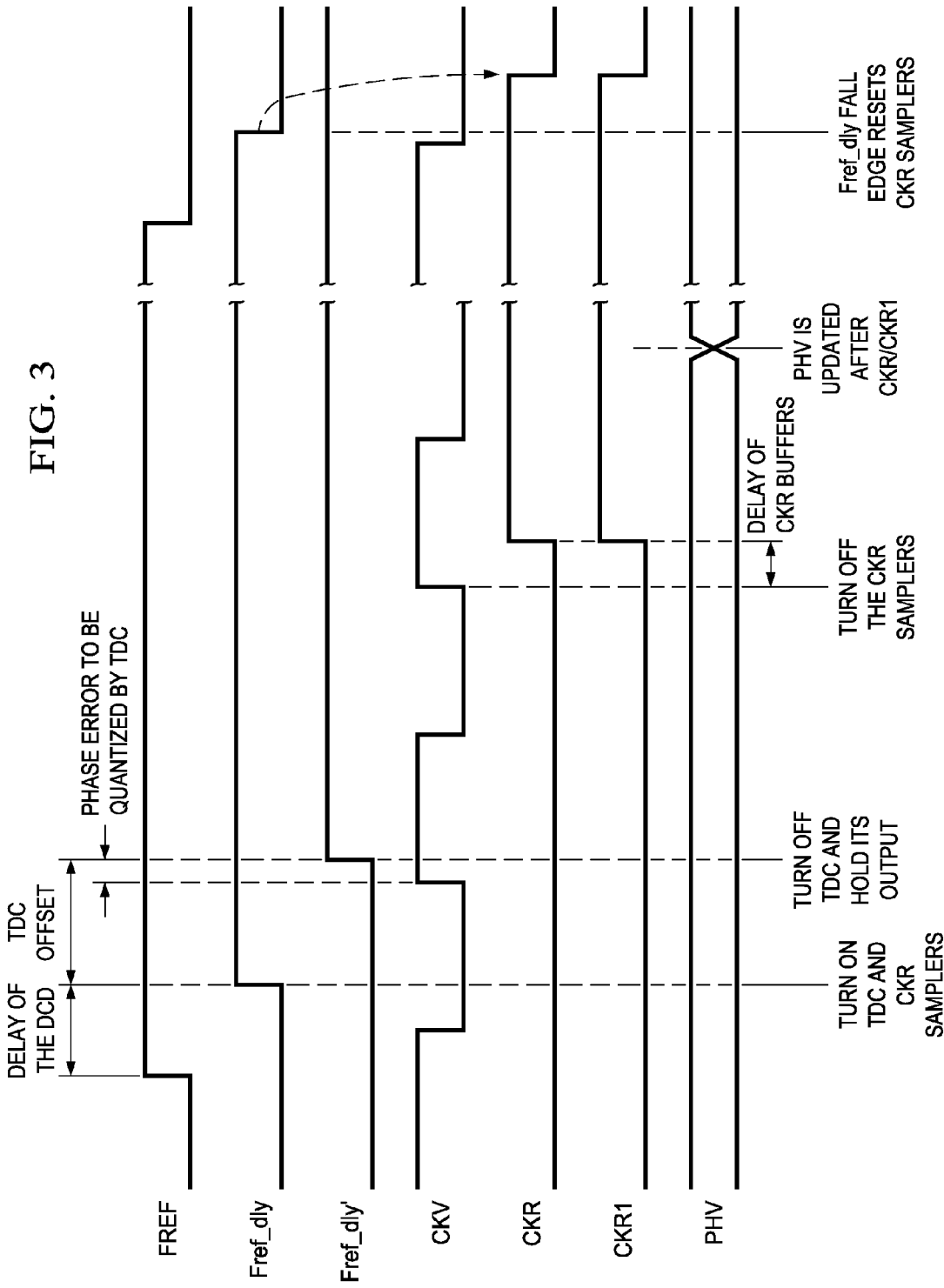
FIG. 3 illustrates a timing diagram for the circuit of FIGS. 2a and 2b.

Operation of the various circuits may be better understood by a timing diagram of FIG. 3. For purposes of illustration, FCW is taken to be a constant (i.e., no modulation) and there is no drift. As described above, the variable phase circuit 232 counts the CKV clocks and latches or samples the count on the active (rising) edge of CKR to provide the signal PHV. Also, at each active edge of CKR, the reference phase circuit 214 accumulates another FCW. FREF is delayed by a digitally-controlled delay cell (DCD), and the rise edge of the Fref_dly turns on the TDC and the CKR samplers in 232 (actually, turns on the CKV input path). The delayed FREF edge is compared with the first CKV edge with some intrinsic TDC offset. The output of the TDC is generated after the first CKV rise edge when the TDC can be turned off while the output TDCout is maintained. The CKR rise edge is generated after the second CKV rise edge and then the samplers are turned off (the CKV input path is turned off). The CKR samplers are reset at the fall edge of the delayed FREF. The TDC offset can be adjusted (e.g. one half of the CKV period) so that the rise edge of the Fref_dly is adequately far away from the rise edge of the CKV during normal operation.

Each of the individual sub-circuits, e.g. TDC, etc., may be implemented in various ways and use various methods. Below are some example implementations along with further description of the purpose and operation of some of the circuit blocks.

The combination of the small TDC 230 and the DCD 212 is to quantize the fractional part of the CKV phase, which is a sawtooth-wave (or pseudo-sawtooth wave) in the normal operation and its frequency is related to the fractional part of FCW. An estimation of KDCD is used for the edge prediction and the phase error normalization. There are errors caused by the DCD non-linearity and the KDCD error which also appear at the input of the loop filter at the sane frequency. Such errors will further modulate DCO and generate some spurious outputs if they are not effectively filtered by the loop filter. Because of the feedback loop of the PILL, the phase errors caused by the DCD non-linearity and the KDCD error have a zero mean, and to have a periodicity Terr, which can be calculated as Tref/F (Tref is the period of reference signal FREF, and F is the fractional part of the FCW). The spectrum of the phase error is generally. Gaussian if there are no systematic errors existing in the loop. The DCD non-linearity and accompanying Terr error are much reduced in this invention because the TDC is small and has only a few stages, and the DCD 212 (feeding the small TDC) may be calibrated.

Figure 8:
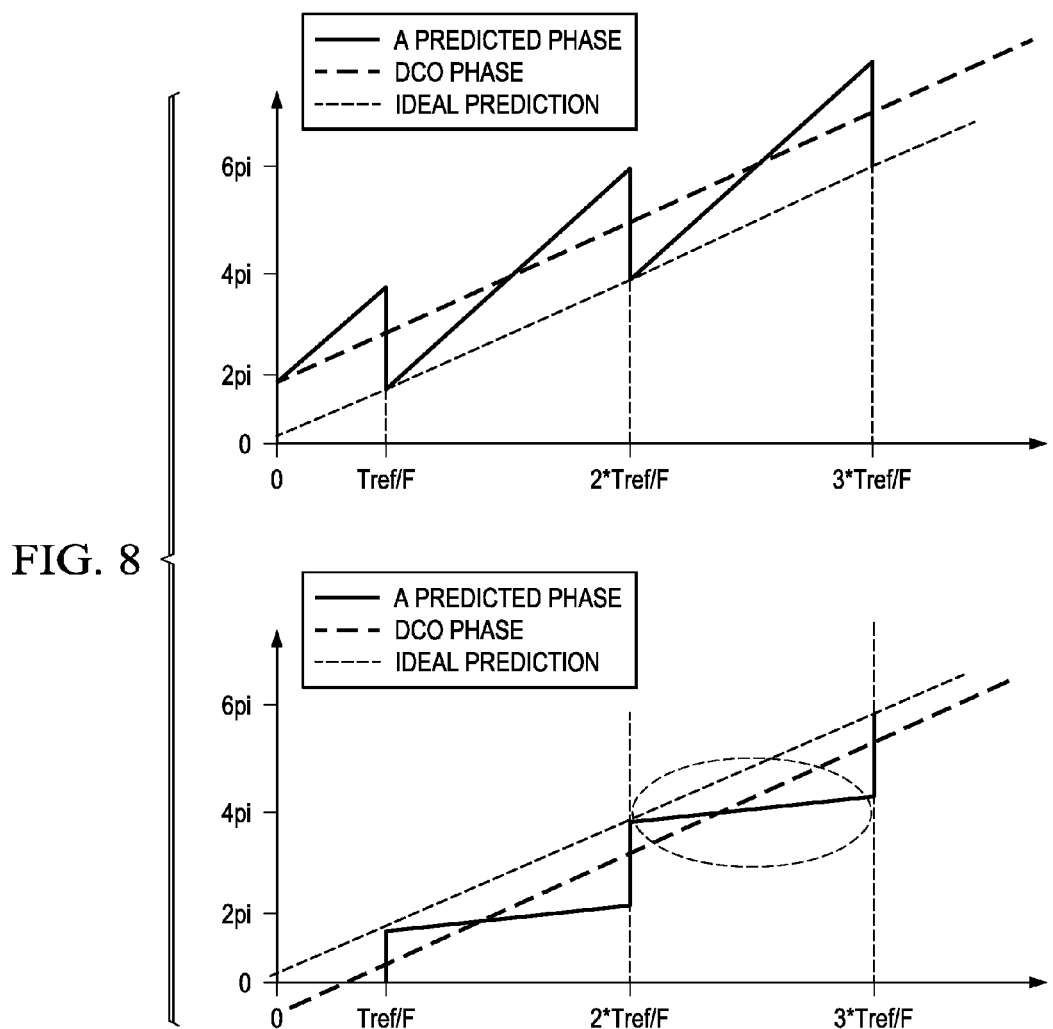
FIG. 8 illustrates that the phase trajectory under DCO gain underestimate and overestimate.

The principle of the KDCD gain estimation is described in this section. The digitally controlled delay DCD 212 cell can employ similar structures as the TDC so that the KTDC conveniently equals or proportional to KDCD (the gain of the delay cell, or to have a fixed relation against PVT variations). There is a cascade of the digitally-controlled delay cells (DCD) but it may be designed to be calibrated and its delay is of a predictive nature where it anticipates the next rising edge of FREF and optimally aligns it with CKV. Both of the TDC and DCD operate at the rate of FREF. There may be situations where KDCD is overestimated and where KDCD is underestimated. In either case, the actual DCO phase tracks the average predicted phase due to the integration properties of the oscillator (i.e., frequency to phase conversion adds a transfer function pole at origin) low-pass effect of the loop as illustrated in FIG. 8, in which a clear correlation between the phase error and the reference phase (Phase_F) can be observed when the KDCD is not estimated precisely. Such correction is used for the KDCD estimation in this invention. The KDCD estimation error can be obtained by averaging the product of (Phase_F−0.5) and PHE_F. Based on the estimation error, the estimated KTDC can be dynamically updated so that such correlation can be minimized. A simplified method is to just check the polarities of PHE_F and the polarities of the (Phase_F−0.5). The polarities of the phase error can be easily obtained by monitoring only one bit in the middle of the thermometer-coded TDC outputs or the sign bit of the PHE_F. This KDCD estimation method may work better when the fractional part of the FCW is far from zero or one, i.e., far from integer-N channels. The KDCD estimation method described is independent of the ADPLL architecture and may be used elsewhere.

A finite time resolution (such as 20 ps~40 ps) in the TDC may result in some undesired quantization effects in the loop performance if it is within the pass band of the loop filter and thus cannot be filtered out. Ideally, when the loop works in a noiseless environment and the FCW is constant, the frequency of the quantization noise can be expressed as, $$f_q = \frac{fref * F}{K_{TDC}} \text{ for } 0 \le F \le \frac{K_{TDC}}{2}$$

where F is the fractional part of the FCW. The frequency of the quantization noise is proportional to the frequency part of FCW with the maximum frequency of fref/2. If the DCO period is integer multiple of the TDC step size, the relation above repeats itself. The quantization noise may appear at the DCO's output if $f_q$ is below the loop bandwidth. To eliminate the effect of the TDC quantization, a 2nd (or higher) order sigma-delta dithering may be added in the edge prediction circuit to push those low frequency tones to higher frequency where they can be filtered output by the loop filter. However, it is possible that adding this dithering affects the accuracy/speed of the KDCD estimation. If this is the case, the estimation of the KDCD may be done with the sigma-delta modulator disabled.

Figure 4:
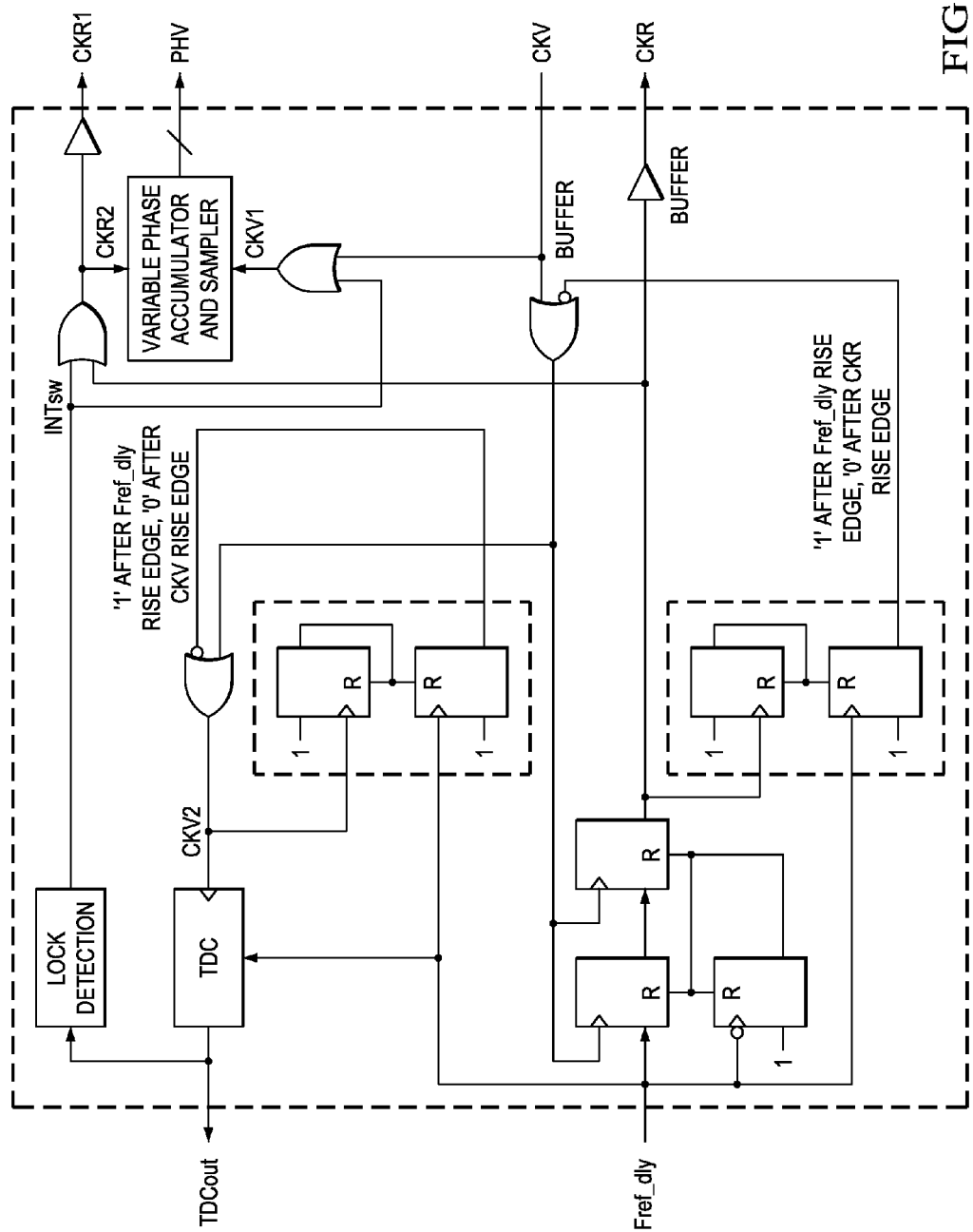
FIG. 4 illustrates a schematic for one embodiment of the TDC, clock generator and lock detector circuit.

FIG. 4 shows an embodiment of the circuitry relating the small TDC, lock detector and CKRs generator. In the locked condition, the timing variation between the edges of the DCD output (Fref_dly) and the DCO output varies within a small range, i.e. within one or two inverter delays. The TDC in the proposed low-power ADPLL employs only a few (6 levels is assumed here) quantization levels. To reduce the power consumption, a logic OR gate is used to disable/enable the CKV path so that the TDC operates in the speed of Fref in this proposed low-power ADPLL. It enables the CKV path right after Fref_dly rising edge and disables it right after the first CKV rise edge appears at the TDC's input. The clocks CKRs are generated by sampling Fref_dly with CKV. Similarly, another logic OR gate is used here to minimize the power consumption. It enables the CKV path for the samplers after Fref_dly until a CKR rise edge is produced. The output, CKR1, which is the clock for the integer part of the reference phase accumulator, is enabled I disabled with the output of the lock detector (INTsw). The variable phase accumulator and sampler are to generate the integer part of the CKV phase. Its inputs, CKV1 (the gated CKV clock) and CKR2, are disabled in locked condition to reduce power consumption. In the locked condition, there are only two OR gates driven at CKV speed, while all others operate at FREF speed to minimize the power consumption.

Example applications and systems which use the ADPLL include wireless data-communications and telecommunications, as shown in FIG. 5. Low power applications typically include battery operated wireless communication equipment such as cell phones and PDA's. The I/Q modulation data of FIG. 2*a* may be part of the baseband section of a cell phone, for example, and the power amplifier (PA) transmits RF data such as the RF clock for a DRP system. Data equipment examples include laptops. Entertainment equipment includes radio, voice and song recorders, or game players etc. Medical equipment particularly personal equipment, hearing aids, heart monitor and other sensors used on the body need low power supply circuits like this invention. Nowadays, hand-held security equipment and taggers (e.g. RFID) all can benefit from low-supply circuits. Alternatively, high-voltage supply applications such as power management circuits, automotive applications, and the like can still benefit from the high speed at which the ADPLL operates. Such applications generally do not involve modulated inputs and the modulation compensator circuit block 290 (FIG. 2*b*) and DTX inputs section may simply be removed, thereby further reducing the circuit size. Intermediate-voltage supply applications such as for communications (e.g. base-stations) or wall-power applications (e.g. computers, televisions) can utilize this invention for a similar purpose.

The system of FIGS. 2*a* and 2*b* may alternatively be implemented as discrete chips on a PC board, as a multi-chip-module (separate die) in a single package, or as circuit blocks on the same chip (IC). System applications, noise concerns, the frequencies involved, and performance specifications dictate the actual implementation.

From the above, it may be appreciated that the preferred embodiments provide a new ADPLL architecture and circuits. While these circuits have been motivated by advances in a MOSFET technology, various alternatives may be used by one skilled in the art wherein these preferred embodiments may be implemented. For example, the MOSFET technology may be replaced by a bipolar, BiCMOS, BiCOM, etc. technology. Given the preceding, therefore, one skilled in the art should further appreciate that while the present embodiments have been described in detail, various substitutions, modifications or alterations could be made to the descriptions set forth above without departing from the inventive spirit and scope, as are defined by the following claims.

The invention claimed is:

1. A circuit, comprising:
an all-digital PLL (ADPLL) circuit for processing digital values having a reference phase accumulator circuit which has an integer circuit operable to process an integer part of the digital values and a fractional circuit operable to process a fractional part of the digital values and operable to disable the integer circuit while in a loop-locked condition.

2. The circuit of claim 1 wherein the ADPLL is further operable to enable the integer circuit while in out of loop-locked condition.

3. The circuit of claim 1 wherein the ADPLL further comprises an integer path circuitry which is disabled when the ADPLL is in loop-locked condition.

4. The circuit of claim 1 wherein the ADPLL further comprises a phase detector section, a loop filter section, a digital oscillator section, and an input from a digital transmit block;
wherein the phase detector section is operable to receive a signal from a frequency command word generator, and the phase detector section couples to the loop filter section;
wherein the loop filter section couples to the digital oscillator section;
wherein the digital oscillator section couples to the phase detector section; and
wherein the digital transmit block couples to the frequency command word generator and also couples to the loop filter section.

5. The circuit of claim 1 wherein the ADPLL further comprises a time-to-digital converter (TDC) operable to quantize a time difference between edges of a predicted clock (CKV) and a master system clock (FREF).

6. A circuit, comprising:
an all-digital PLL (ADPLL) circuit for processing digital values, comprising:
a reference phase accumulator circuit which has an integer circuit operable to process an integer part of the digital values;
a fractional circuit operable to process a fractional part of the digital values and operable to disable the integer circuit while in a loop-locked condition; and
a modulation compensator block for receiving an input from a digital transmit block and the modulation compensator block for providing outputs to a frequency command word generator and a phase detector section.

7. A circuit, comprising:
an all-digital PLL (ADPLL) circuit for processing digital values, comprising:
a reference phase accumulator circuit which has an integer circuit operable to process an integer part of the digital values;
a fractional circuit operable to process a fractional part of the digital values and operable to disable the integer circuit while in a loop-locked condition; and
a time-to-digital converter (TDC) operable to quantize a time difference between edges of a predicted clock (CKV) and a master system clock (FREF), wherein the TDC comprises a small TDC, a gain estimator (KTDC), and a digitally controlled delay cell (DCD) coupled to the small TDC and gain estimator (KTDC).

8. A wireless application circuit comprising:
an RF transmitter having a digital RF processor architecture and an all-digital PLL (ADPLL) circuit for processing digital values;
wherein the ADPLL has a reference phase accumulator circuit which has an integer circuit operable to process an integer part of the digital values and a fractional circuit operable to process a fractional part of the digital values; and
wherein the ADPLL is operable to disable the integer circuit while in a loop-locked condition.

9. The wireless application circuit of claim 8 wherein the ADPLL further comprises an integer path circuitry and the integer path circuitry is disabled when the ADPLL is in the loop-locked condition.

10. The wireless application circuit of claim 8 wherein the ADPLL further comprises a phase detector section, a loop filter section, a digital oscillator section, and an input from a digital transmit block;
wherein the phase detector section is operable to receive a signal from a frequency command word generator, and the phase detector section couples to the loop filter section;
wherein the loop filter section couples to the digital oscillator section; wherein the digital oscillator section couples to the phase detector section; and
wherein the digital transmit block couples to the frequency command word generator and also couples to the loop filter section.

11. The wireless application circuit of claim 8 wherein the ADPLL further comprises a time-to-digital converter (TDC) operable to quantize a time difference between edges of a predicted clock (CKV) and a master system clock (FREF).

12. A wireless application circuit comprising:
an RF transmitter having a digital RF processor architecture and an all-digital PLL (ADPLL) circuit for processing digital values;
wherein the ADPLL has a reference phase accumulator circuit which has an integer circuit operable to process an integer part of the digital values and a fractional circuit operable to process a fractional part of the digital values;
wherein the ADPLL is operable to disable the integer circuit while in a loop-locked condition; and
wherein the ADPLL further comprises a modulation compensator block for receiving an input from a digital transmit block and the modulation compensator block for providing outputs to a frequency command word generator and a phase detector section.

13. A wireless application circuit comprising:
an RF transmitter having a digital RF processor architecture and an all-digital PLL (ADPLL) circuit for processing digital values;
wherein the ADPLL has a reference phase accumulator circuit which has an integer circuit operable to process an integer part of the digital values and a fractional circuit operable to process a fractional part of the digital values and a time-to-digital converter (TDC) coupled to the reference phase accumulator;
wherein the ADPLL is operable to disable the integer circuit while in a loop-locked condition; and
wherein the TDC comprises a small TDC, a gain estimator (KTDC), and a digitally controlled delay cell (DCD) coupled to the small TDC and the gain estimator (KTDC).

14. A method to generate a clock output signal comprising steps of:
processing digital values using an all-digital PLL (ADPLL) circuit;

processing an integer part of the digital values using an integer circuit portion of a reference phase accumulator circuit;

processing a fractional part of the digital values using a fractional circuit portion of the reference phase accumulator circuit;

operating the ADPLL in a loop-locked condition; and disabling the integer circuit portion while in said loop-locked condition.

15. The method of claim 14 further comprising a step of automatically enabling the integer circuit portion when the ADPLL is out of the loop-locked condition.

16. The method of claim 15 further comprising a step of disabling additional circuitry along an integer path coupled to the integer circuit portion of the reference phase accumulator circuit during loop-locked condition.

17. The method of claim 14 further comprising a step of running a time-to-digital converter (TDC) in the ADPLL to quantize a time difference between edges of a predicted clock (CKV) and a master system clock (FREF), using a resolution quantization of six levels or less.

18. The method of claim 17 further comprising a step of running the TDC on the master system clock FREF to reduce power.

19. The method of claim 14 further comprising a step of running the ADPLL on the master system clock FREF to reduce power.

20. A method to generate a clock output signal comprising steps of:

processing digital values using an all-digital PLL (ADPLL) circuit;

processing an integer part of the digital values using an integer circuit portion of a reference phase accumulator circuit;

processing a fractional part of the digital values using a fractional circuit portion of the reference phase accumulator circuit;

operating the ADPLL in a loop-locked condition, the ADPLL loop receiving a varying input from a digital transmit block;

compensating for the variation of the varying input, wherein the compensating includes filtering by integrating and resampling; and disabling the integer circuit portion.

21. A system comprising a phase-locked loop (PLL), wherein said PLL comprises:

a frequency reference input for receiving a reference clock;

a controllable oscillator for generating a radio frequency (RF) clock, said controllable oscillator responsive to a tuning word;

a digitally-controlled delay (DCD) circuit for delaying said reference clock in response to a delay control signal, said DCD producing a delayed reference clock; and a time-to-digital converter (TDC) for measuring a time difference between said RF clock and said delayed reference clock;

a reference phase circuit for accumulating a frequency command word (FCW); and an edge predictor circuit, said edge predictor circuit coupled to said reference phase circuit to produce said delay control signal.

22. A system comprising a phase-locked loop (PLL), wherein said PLL comprises:

a frequency reference input for receiving a reference clock;

a controllable oscillator for generating a radio frequency (RF) clock, said controllable oscillator responsive to a tuning word;

a digitally-controlled delay (DCD) circuit for delaying said reference clock in response to a delay control signal, said DCD producing a delayed reference clock; and a time-to-digital converter (TDC) for measuring a time difference between said RF clock and said delayed reference clock;

a reference phase circuit for accumulating a frequency command word (FCW), said reference phase circuit comprising an integer part accumulator and a fractional part accumulator, said fractional part accumulator operable to process a fractional part of said FCW; and wherein said delay control signal is a function of said fractional part accumulator.

23. A system comprising a phase-locked loop (PLL), wherein said PLL comprises:

a frequency reference input for receiving a reference clock;

a controllable oscillator for generating a radio frequency (RF) clock, said controllable oscillator responsive to a tuning word;

a digitally-controlled delay (DCD) circuit for delaying said reference clock in response to a delay control signal, said DCD producing a delayed reference clock; and a time-to-digital converter (TDC) for measuring a time difference between said RF clock and said delayed reference clock; and a reference phase circuit for accumulating a frequency command word (FCW), said reference phase circuit comprising an integer part accumulator and a fractional part accumulator, said fractional part accumulator operable to process a fractional part of said FCW, wherein said integer part accumulator is coupled to receive a carry out signal of said fractional part accumulator.

24. A system comprising a phase-locked loop (PLL), wherein said PLL comprises:

a frequency reference input for receiving a reference clock;

a controllable oscillator for generating a radio frequency (RF) clock, said controllable oscillator responsive to a tuning word;

a digitally-controlled delay (DCD) circuit for delaying said reference clock in response to a delay control signal, said DCD producing a delayed reference clock; and a time-to-digital converter (TDC) for measuring a time difference between said RF clock and said delayed reference clock; and a reference phase circuit for accumulating a frequency command word (FCW), comprising an integer part accumulator and a fractional part accumulator, said fractional part accumulator operable to process a fractional part of said FCW, said integer part accumulator operable in a set of enable and disable modes, wherein said integer part accumulator is disabled in a locked condition of said ADPLL.

25. A system comprising a phase-locked loop (PLL), wherein said PLL comprises:

a frequency reference input for receiving a reference clock;

a controllable oscillator for generating a radio frequency (RF) clock, said controllable oscillator responsive to a tuning word;

a digitally-controlled delay (DCD) circuit for delaying said reference clock in response to a delay control signal, said DCD producing a delayed reference clock; and a time-to-digital converter (TDC) for measuring a time difference between said RF clock and said delayed reference clock;

a reference phase circuit for accumulating a frequency command word (FCW);

an edge predictor circuit, said edge predictor circuit coupled to said reference phase circuit to produce said delay control signal; and a variable phase circuit coupled to said edge predictor circuit.

26. The system of claim 25, wherein said variable phase circuit comprises edge counting means of said RF clock.

27. The system of claim 25 further comprising a phase detector coupled to said reference phase circuit and said variable phase circuit, said phase detector producing phase error samples.

28. The system of claim 27 further comprising a loop filter coupled to said phase detector for filtering of said phase error samples.

29. The system of claim 28 further comprising a gain circuit coupled between said loop filter and said controllable oscillator, said gain circuit producing frequency tuning control.

30. The system of claim 27 further comprising a resampler coupled between said phase detector and a loop filter, said loop filter operative on a clock derived from said RF clock.

31. The system of claim 30, wherein said resampler comprises a zero order hold (ZOH) circuit operative on integer part of said phase error samples.

32. They system of claim 30, wherein said resampler comprises a first order interpolator circuit operative on fractional part of said phase error samples.

33. They system of claim 30 being a transmitter, further comprising a data modulating input for receiving data modulating samples, said data modulating samples coupled to said controllable oscillator for performing frequency modulation of said RF clock.

34. They system of claim 33 further comprising a modulation compensation circuit for receiving said data modulating samples and coupled to said reference phase circuit.

35. A method to generate a clock output signal comprising steps of:

receiving a frequency reference signal;

delaying said frequency reference signal by a controllable amount;

measuring a time difference between a result of said delaying step and said clock output signal;

adjusting frequency of said clock output signal based on a result of said measuring step;

accumulating a frequency command word (FCW) to produce a reference phase signal; and wherein said controllable amount in said delaying step is a function of said reference phase signal.

36. A method of gain estimation of a time-to-digital converter (TDC) comprising: measuring a time difference between a first clock and a second clock; producing digital value representative of a quantized result of said measuring step; multiplying said digital value by a normalizing multiplier to produce normalized TDC output, processing said normalized TDC output, wherein said processing step comprises performing calculation on said normalized TDC output and adjusting said normalizing multiplier based on a result of said processing step.

37. The method of claim 36 further comprising a step of estimating said time difference.

38. The method of claim 37, wherein said processing step comprises correlating said TDC normalized output with said estimated time difference.

39. A system comprising: a time-to-digital converter (TDC) for measuring a time difference between a reference clock and a variable clock, said TDC producing digital samples synchronous to said reference clock; a normalizing circuit coupled to receive said digital samples, said normalizing circuit producing normalized digital samples in response to a multiplier value; and a TDC gain estimation circuitry coupled to receive said normalized digital samples, said TDC gain estimation circuitry adjusting said multiplier value and performing comparison of said normalized digital samples with a predicted phase.

40. A system comprising: a time-to-digital converter (TDC) for measuring a time difference between a reference clock and a variable clock, said TDC producing digital samples synchronous to said reference clock; a normalizing circuit coupled to receive said digital samples, said normalizing circuit producing normalized digital samples in response to a multiplier value; and a TDC gain estimation circuitry coupled to receive said normalized digital samples, performing calculation on said normalized digital samples; said TDC gain estimation circuitry adjusting said multiplier value.

\* \* \* \* \*